United States Patent
Kuroda et al.

(10) Patent No.: US 10,622,953 B1
(45) Date of Patent: Apr. 14, 2020

(54) AMPLIFICATION DEVICE, RADIO COMMUNICATION APPARATUS, AND AMPLIFICATION CONTROL METHOD

(71) Applicant: FUJITSU LIMITED, Kawasaki-shi, Kanagawa (JP)

(72) Inventors: Osamu Kuroda, Sendai (JP); Takumi Takayashiki, Sendai (JP); Yuuji Osada, Natori (JP); Daiki Kasugai, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/563,602

(22) Filed: Sep. 6, 2019

(30) Foreign Application Priority Data

Sep. 27, 2018 (JP) ................ 2018-182637

(51) Int. Cl.
*H04B 1/04* (2006.01)
*H03F 3/19* (2006.01)
*H01P 5/18* (2006.01)
*H03F 1/02* (2006.01)
*H01P 1/36* (2006.01)

(52) U.S. Cl.
CPC ............. *H03F 3/19* (2013.01); *H01P 5/18* (2013.01); *H03F 1/0288* (2013.01); *H04B 1/04* (2013.01); *H01P 1/36* (2013.01); *H03F 2200/451* (2013.01); *H04B 2001/045* (2013.01); *H04B 2001/0433* (2013.01)

(58) Field of Classification Search
CPC .......... H04B 1/04; H04B 1/0475; H04B 1/16; H03F 1/0288; H03F 1/32; H03F 3/19; H03F 3/24; H03F 3/195; H03F 3/45; H05P 1/52; H05P 1/58
See application file for complete search history.

(56) References Cited

U.S. PATENT DOCUMENTS

| 6,799,020 | B1 | 9/2004 | Heidmann et al. |
| 10,128,876 | B2 * | 11/2018 | Shen .......... H03F 3/24 |
| 10,250,209 | B2 * | 4/2019 | Tsutsui .......... H03F 3/195 |
| 2003/0001669 | A1 * | 1/2003 | Billsberry .......... H03F 1/32 330/52 |

(Continued)

FOREIGN PATENT DOCUMENTS

| JP | 2003-527771 A | 9/2003 |
| JP | 2005-516524 A | 6/2005 |

(Continued)

*Primary Examiner* — Thanh C Le
(74) *Attorney, Agent, or Firm* — Arent Fox LLP

(57) ABSTRACT

An amplification device includes a plurality of amplifiers arranged in parallel, a plurality of directional couplers coupled to the plurality of amplifiers, respectively, and configured to receive output signals of the plurality of amplifiers, respectively, a phase shifter coupled to a first directional coupler of the plurality of directional couplers, and configured to generate a first signal to which a phase of an output signal of the first directional coupler is inverted, a combining circuit coupled to the phase shifter and a second directional coupler of the plurality of directional couplers, and configured to combine an output signal of the phase shifter and an output signal of the second directional coupler, and a processor configured to control at least one of the plurality of amplifiers so that a level of an output signal of the combining circuit is minimized.

15 Claims, 8 Drawing Sheets

(56) References Cited

U.S. PATENT DOCUMENTS

| | | | |
|---|---|---|---|
| 2004/0183593 A1 | 9/2004 | Kwon et al. | |
| 2015/0116039 A1 | 4/2015 | Ahmed et al. | |
| 2017/0019128 A1* | 1/2017 | Pack | H04B 1/0475 |
| 2019/0165740 A1* | 5/2019 | McLaren | H03F 1/0288 |

FOREIGN PATENT DOCUMENTS

| | | |
|---|---|---|
| JP | 2015-089130 A | 5/2015 |
| JP | 2017-175424 A | 9/2017 |

* cited by examiner

AMPLIFICATION DEVICE, RADIO COMMUNICATION APPARATUS, AND AMPLIFICATION CONTROL METHOD

CROSS-REFERENCE TO RELATED APPLICATION

This application is based upon and claims the benefit of priority of the prior Japanese Patent Application No. 2018-182637, filed on Sep. 27, 2018, the entire contents of which are incorporated herein by reference.

FIELD

The embodiments discussed herein are related to an amplification device, a radio communication apparatus, and an amplification control method.

BACKGROUND

A power amplification device including a distributing unit that distributes input signals, a plurality of amplifying units that amplify the input signals distributed by the distributing unit, and a combining unit that combines the output signals of the plurality of amplifying units is known in the related art.

Related techniques are disclosed in, for example, Japanese Laid-open Patent Publication No. 2017-175424.

SUMMARY

According to an aspect of the invention, an amplification device includes a plurality of amplifiers arranged in parallel, a plurality of directional couplers coupled to the plurality of amplifiers, respectively, and configured to receive output signals of the plurality of amplifiers, respectively, a phase shifter coupled to a first directional coupler of the plurality of directional couplers, and configured to generate a first signal to which a phase of an output signal of the first directional coupler is inverted, a combining circuit coupled to the phase shifter and a second directional coupler of the plurality of directional couplers, and configured to combine an output signal of the phase shifter and an output signal of the second directional coupler, and a processor configured to control at least one of the plurality of amplifiers so that a level of an output signal of the combining circuit is minimized.

The object and advantages of the invention will be realized and attained by unit of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

When a plurality of amplifiers are connected in parallel, and when the amplitudes or phases of the signals output from the respective amplifiers are deviated, a combined loss of the respective output signals may occur, which may lower the efficiency of an amplification device.

Hereinafter, an embodiment of a technique capable of preventing a decrease in efficiency of an amplification device will be described.

The amplification device of the present embodiment is used, for example, in a radio communication apparatus such as a radio base station apparatus. The radio base station apparatus may be called an RRH (Remote Radio Head) or RRE (Remote Radio Equipment). The radio base station apparatus performs processes such as a modulation, an up-conversion, an amplification, and the like on a baseband signal supplied from an external controller, and wirelessly transmits a transmission signal obtained after the amplification process via an antenna. The amplification device of the present embodiment has a function of performing at least the amplification process.

The amplification device of the present embodiment includes, for example, an amplification circuit formed on an MMIC (Monolithic Microwave Integrated Circuit). The amplification circuit formed on the MMIC in the amplification device is advantageous in a point of view for miniaturization of the amplification device for high frequency and high power.

The amplification device of the present embodiment has an amplification circuit that amplifies a signal by a plurality of power amplifiers formed using, for example, transistors such as GaN (gallium nitride) devices. A GaN device has excellent high frequency output characteristics since the GaN device has a wider band gap and higher mobility than other semiconductor devices such as Si-LDMOS (silicon lateral diffusion metal oxide semiconductor), GaAs-FET (gallium arsenide field effect transistor), etc.

Next, for the purpose of comparison with the radio communication apparatus of the present embodiment, the configuration of a radio communication apparatus of a comparative example will be described.

Figure 1:
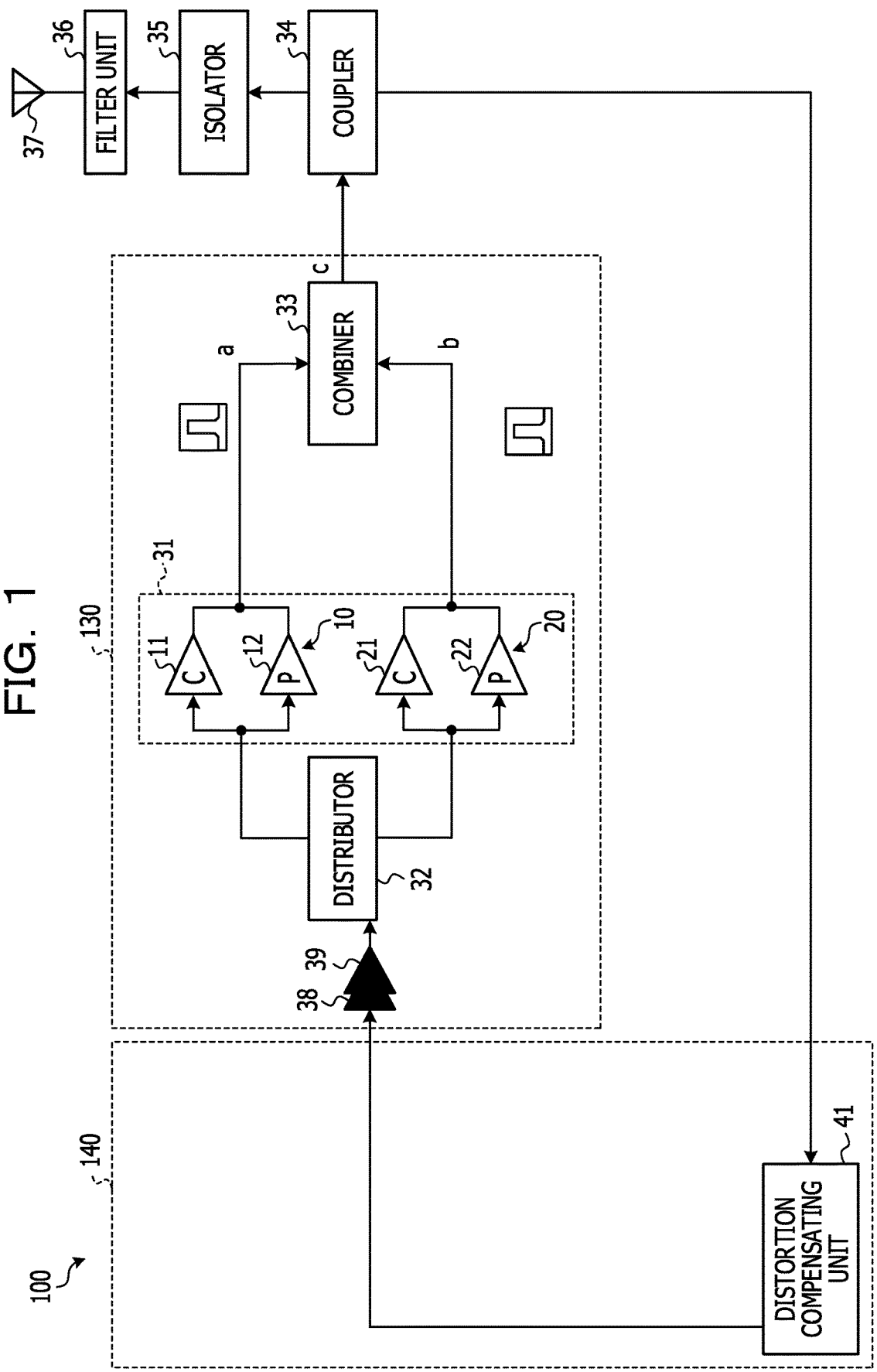
FIG. 1 is a view illustrating an example of the configuration of a radio communication apparatus according to a comparative example.

FIG. 1 is a view illustrating an example of the configuration of a radio communication apparatus according to a comparative example. The radio communication apparatus 100 illustrated in FIG. 1 mainly includes a digital signal processing unit 140, an amplifying unit 130, a coupler 34, an isolator 35, a filter unit 36, and an antenna 37.

The digital signal processing unit 140 includes a distortion compensating unit 41 that compensates for non-linear distortion that occurs in a transmission signal that has been amplified by the amplifying unit 130 by performing a distortion compensation process on a baseband signal supplied from an external controller (not illustrated). The distortion compensating unit 41 performs the distortion compensation process on the baseband signal based on a difference between a feedback signal from the coupler 34 and the baseband signal supplied from the external controller. The baseband signal subjected to the distortion compensation process by the distortion compensating unit 41 (the distortion compensation processed-baseband signal) is supplied to the amplifying unit 130.

The amplifying unit 130 includes a DA (Digital to Analog) converter 38 that converts the distortion compensation processed-baseband signal from a digital signal to an analog signal, and an up-converter 39 that up-converts an analog baseband signal output from the DA converter 38. The amplifying unit 130 amplifies the baseband signal up-converted by the up-converter 39 to generate a transmission signal having a higher output level than the baseband signal before amplification, and outputs the generated transmission signal to the coupler 34.

The coupler 34 outputs the transmission signal amplified by the amplifying unit 130, to the isolator 35, splits a part of the transmission signal, and feeds back the split transmission signal to the distortion compensating unit 41.

The isolator 35 passes the transmission signal output from the coupler 34, to the filter unit 36, and blocks a signal such as a reflected wave from the filter unit 36 toward the coupler 34.

The filter unit 36 removes the noise of the transmission signal supplied from the isolator 35 and outputs the transmission signal with no noise to the antenna 37. Thus, a transmission signal, which has an output level higher than that of the baseband signal before amplification, is transmitted to the outside of the radio communication apparatus through the antenna 37.

The amplifying unit 130 is equipped with a distributor 32, an amplification circuit 31, and a combiner 33 in an effort to increase the power of the transmission signal. The amplification circuit 31 includes a plurality of amplifiers (a first amplifier 10 and a second amplifier 20 in the case of FIG. 1) whose inputs and outputs are respectively connected in parallel with each other.

The distributor 32 distributes the baseband signal up-converted by the up-converter 39 to the plurality of amplifiers 10 and 20. The plurality of amplifiers 10 and 20 amplify the baseband signal distributed thereto. The output signals of the plurality of amplifiers 10 and 20 are combined by the combiner 33 after an impedance matching. The combiner 33 outputs a transmission signal, which is obtained by combining the output signals of the plurality of amplifiers 10 and 20, to the coupler 34.

Figure 2:
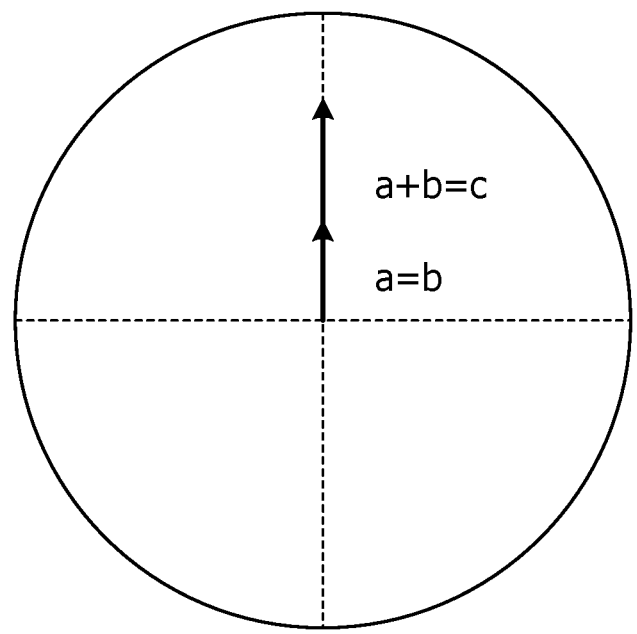
FIG. 2 is a vector diagram illustrating an example of combining two signals having the same phase and amplitude.

As illustrated in FIG. 2, when a signal output from the first amplifier 10 (transmission wave a) and a signal output from the second amplifier 20 (transmission wave b) are combined by the combiner 33 in the same phase and the same amplitude as an ideal case, a combined transmission wave c with twice the output power is obtained.

Figure 3:
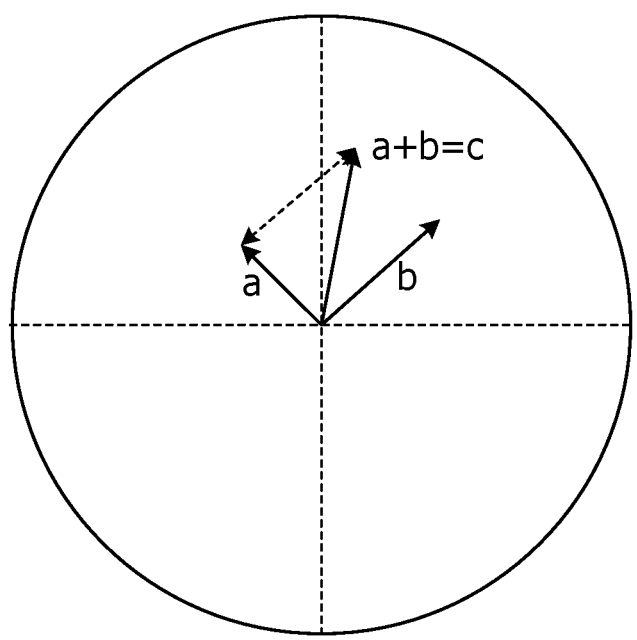
FIG. 3 is a vector diagram illustrating an example of combining two signals having different phases and amplitudes.

However, as illustrated in FIG. 3, when the transmission wave a and the transmission wave b having different phases or amplitudes are combined, a combined loss becomes relatively large, which may cause a problem of reduced power of the combined transmission wave c and poor efficiency of the amplification device. FIG. 3 illustrates a case where both the phases and the amplitudes are different from each other in the transmission waves a and b. In particular, in order to increase the efficiency of the amplification device, a Doherty amplifier including a carrier amplifier C and a peak amplifier P may be employed as at least one of the amplifiers 10 and 20. Since the Doherty amplifier has larger variations in phase and amplitude than a class A amplifier, the efficiency of the amplification device may be rather deteriorated even when the Doherty amplifier is adopted to achieve high efficiency.

Therefore, in order to solve such a problem, the amplification device of the present embodiment implements an optimal combination by changing the phase and amplitude of one amplifier of the plurality of amplifiers connected in parallel so that the amplification characteristic of the one amplifier is closer to the amplification characteristic of the other amplifier.

For example, the amplification device of the present embodiment includes directional couplers respectively mounted on the outputs of the plurality of amplifiers connected in parallel. The transmission waves are respectively extracted by the mounted directional couplers. The amplification device further includes a phase inversion circuit that inverts the phase of one of the extracted transmission waves. By combining the phase-inverted one transmission wave and the other transmission wave by a combining circuit, the transmission waves are canceled from each other to obtain a differential signal of the transmission waves. In addition, a Doherty amplifier having a carrier amplifier and a peak amplifier has the characteristics that the phase and amplitude of the transmission wave are changed by changing the gate bias of the amplifier. The amplification device of the present embodiment includes a controller that changes the gate bias of an amplifier (mainly, a peak amplifier) so as to always minimize the differential signal obtained by the combining circuit using the characteristics.

With such a configuration, the amplification device of the present embodiment may always perform an optimal transmission wave combination to implement the optimal combination even when the environments such as the temperature and the like changes.

Next, the configuration example of the amplification device of the present embodiment will be described in more detail.

Figure 4:
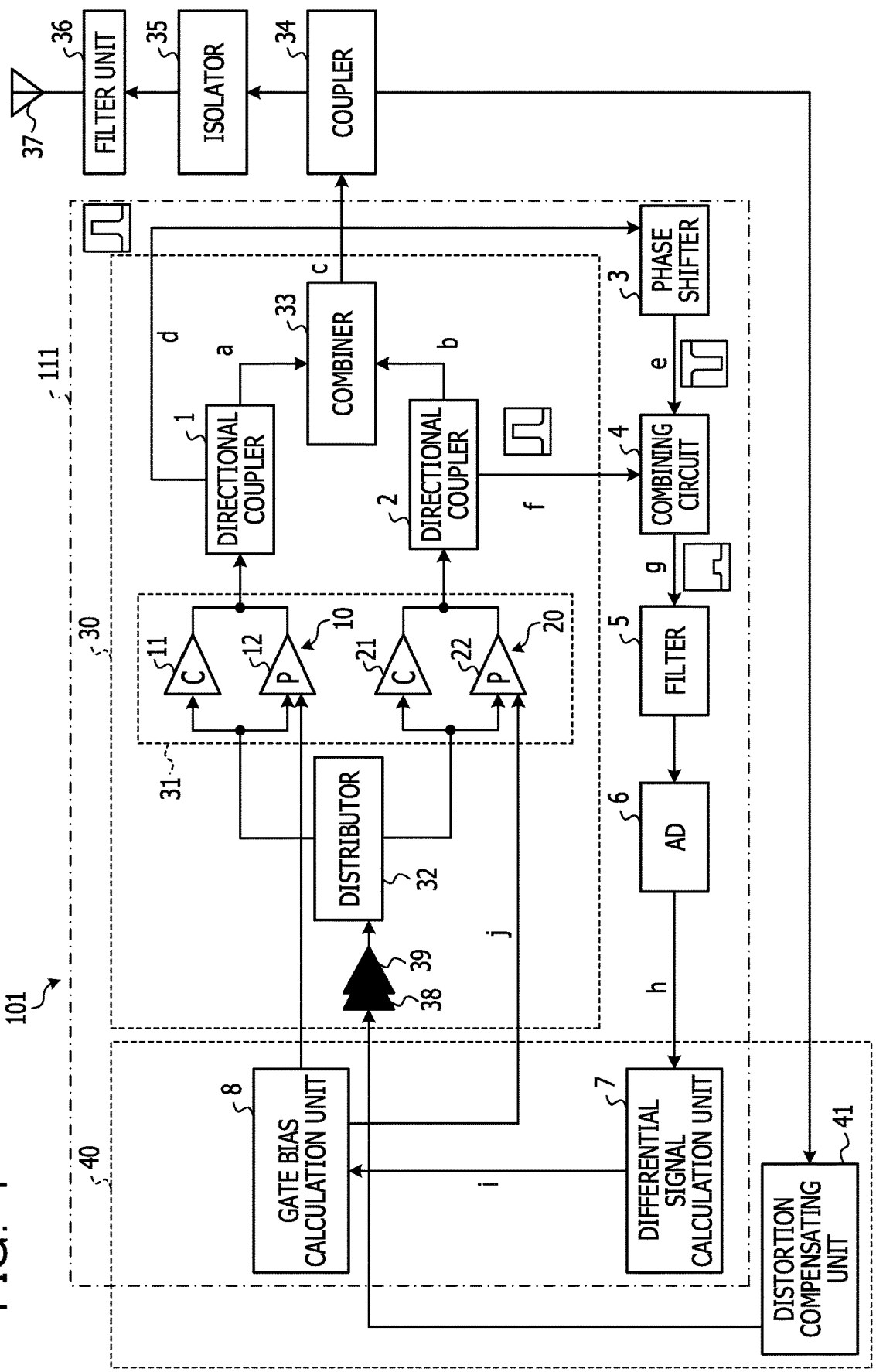
FIG. 4 is a view illustrating an example of the configuration of a radio communication apparatus according to a first embodiment.

FIG. 4 is a view illustrating an example of the configuration of a radio communication apparatus 101 provided with an amplification device 111 of the first embodiment. The same components as those illustrated in FIG. 1 are denoted by the same reference numerals, and the explanation thereof will be omitted or simplified by referring to the above description.

The radio communication apparatus 101 illustrated in FIG. 4 mainly includes a digital signal processing unit 40, an amplifying unit 30, a coupler 34, an isolator 35, a filter unit 36, and an antenna 37.

The digital signal processing unit 140 includes a distortion compensating unit 41 that compensates for the non-linear distortion that occurs in a transmission signal amplified by the amplifying unit 30 by performing a distortion compensation process on a baseband signal supplied from an external controller (not illustrated). The digital signal processing unit 40 further includes a differential signal calculation unit 7 and a gate bias calculation unit 8. The functions of the differential signal calculation unit 7 and the gate bias calculation unit 8 will be described later. The functions of the respective units in the digital signal processing unit 40 are implemented, for example, when a CPU (Central Processing Unit) is operated according to a program readably stored in a memory.

The amplifying unit 30 amplifies the baseband signal up-converted by the up-converter 39 to generate a transmission signal having a higher output level than the baseband signal before amplification, and outputs the generated transmission signal to the coupler 34.

The amplifying unit 30, in an effort to increase the power of the transmission signal, includes a distributor 32, an amplification circuit 31, and a combiner 33. The amplification circuit 31 includes a plurality of amplifiers (a first amplifier 10 and a second amplifier 20 in the case of FIG. 4) whose inputs and outputs are respectively connected in parallel with each other.

The first amplifier 10 is, for example, a Doherty amplifier including a carrier amplifier 11 and a peak amplifier 12 whose input and output are respectively connected in parallel with each other, and the second amplifier 20 is, for example, a Doherty amplifier including a carrier amplifier 21 and a peak amplifier 22 whose input and output are respectively connected in parallel with each other.

The carrier amplifiers 11 and 21, which are, for example, class AB bias power amplifiers that have linearity in a region where the input power is relatively small, amplify the power of a signal input from the distributor 32 and output the amplified signal. Meanwhile, the peak amplifiers 12 and 22, which are, for example, class C bias power amplifiers used only when the input power is relatively large, amplify the power of a signal input from the distributor 32 and output the amplified signal.

In a region where the amplitude level of the input signal is relatively small, only the carrier amplifiers 11 and 21 perform the amplification operation, whereas the amplification operation of the peak amplifiers 12 and 22 is stopped to achieve a low power consumption in the region where the amplitude level of the input signal is relatively small. As the amplitude level of the input signal increases, since the peak amplifiers 12 and 22 gradually perform the amplification operation, the signals output from the carrier amplifier and the peak amplifier, respectively, are combined to output a relatively high power transmission signal. In a region where the amplitude level of the input signal further increases and the maximum amplitude level is input, a saturated power signal is output from both the carrier amplifier and the peak amplifier. Therefore, the power added efficiency (PAE) of the amplification circuit 31 may be increased.

The amplification device 111 of the first embodiment illustrated in FIG. 4 includes, for example, directional couplers 1 and 2, a phase shifter 3, a combining circuit 4, a filter 5, an AD (Analog to Digital) converter 6, a differential signal calculation unit 7, and a gate bias calculation unit 8.

The first directional coupler 1 is a device that is disposed in a signal line between the output of the first amplifier 10 and the first input of the combiner 33, and extracts a part of the output signal of the first amplifier 10 (transmission wave d).

The second directional coupler 2 is a device that is disposed in a signal line between the output of the second amplifier 20 and the second input of the combiner 33, and extracts a part of the output signal of the second amplifier 20 (transmission wave f).

The phase shifter 3 is a phase inversion circuit that inverts the phase of the signal extracted from the first directional coupler 1 (transmission wave d). The phase shifter 3 outputs a signal obtained by inverting the phase of the transmission wave d (transmission wave e).

The combining circuit 4 is a combiner that combines the transmission wave e and the transmission wave f. The combining circuit 4 outputs a differential signal obtained by combining the transmission wave e and the transmission wave f (differential wave g).

The filter 5 is a band-pass filter circuit that removes the frequency components other than the frequency band of the differential wave g.

The AD converter 6 is a circuit that converts an analog differential signal output from the filter 5 (differential wave g) into a digital differential signal h.

The differential signal calculation unit 7 calculates a parameter i for adjusting the level of the differential wave g (i.e., the differential signal h) to the minimum. The parameter i is a value used to control the gate bias of at least one of the amplifiers 10 and 20.

The gate bias calculation unit 8 outputs a control signal that controls the gate bias j of amplifiers (mainly, the peak amplifiers 12 and 22) in accordance with the parameter i calculated by the differential signal calculation unit 7. The differential signal calculation unit 7 and the gate bias calculation unit 8 are examples of a controller that controls the gate bias of at least one of the plurality of amplifiers so as to minimize the output signal of the combiner.

Next, an example of the operation of the amplification device 111 of the first embodiment illustrated in FIG. 4 will be described. [Extraction Operation of Transmission Wave of Amplifiers 10 and 11]

The transmission wave a output from the amplifier 10 is output from a coupling port of the first directional coupler 1, and the transmission wave b output from the amplifier 20 is output from a coupling port of the second directional coupler 2. Meanwhile, the phase of the transmission wave d extracted from an extraction port of the first directional coupler 1 is inverted by the phase shifter 3. The combining circuit 4 performs a process of combining the transmission wave e, whose phase is inverted with respect to the transmission wave d, and the transmission wave f extracted from the extraction port of the second directional coupler 2 to cancel the transmission waves.

[Differential Detection Operation of Each Transmission Wave]

A transmission wave that is not able to be completely canceled by the combining circuit 4 is extracted as a differential wave g. The differential wave g is input to the AD converter 6 via the filter 5 that cuts a noise other than the differential wave g. The analog differential signal (differential wave g) is converted into a digital signal by the AD converter 6.

[Differential Signal Correction Calculation Operation]

The differential signal calculation unit 7 instructs to the gate bias calculation unit 8 the parameter i which changes the gate bias so that the differential signal h output from the AD converter 6 is always minimized. When calculating the parameter i, the differential signal calculation unit 7 shifts a method of adjusting the change amount of the gate bias from a coarse adjustment to a fine adjustment, and searches for the optimal value of the parameter i that minimizes the differential signal h (i.e., the gate bias).

[Gate Bias Variable Correction Operation]

Figure 5:
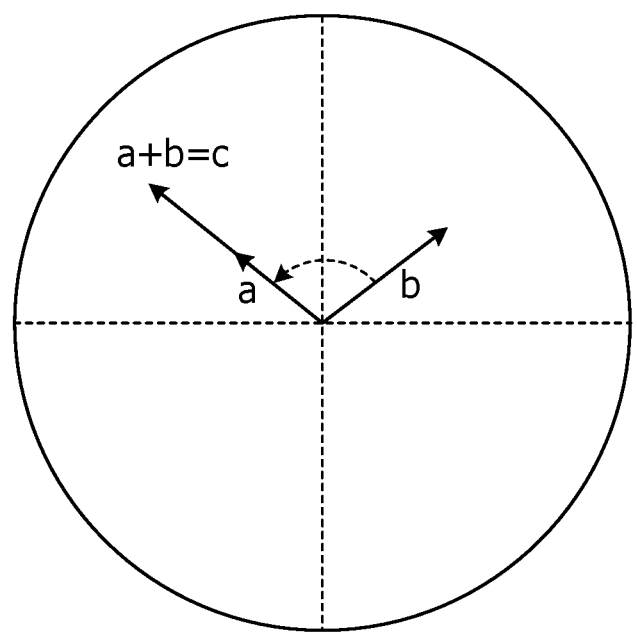
FIG. 5 is a vector diagram illustrating an example of combining two signals after adjusting the phase and amplitude.

In the case of a Doherty amplifier, it is easier to largely change the amplitude and phase of a signal output from the Doherty amplifier by changing the gate bias of the peak amplifier than by changing the gate bias of the carrier amplifier. Taking advantage of this characteristic, the differential signal calculation unit 7 and the gate bias calculation unit 8 change the phase and amplitude of the second amplifier 20 by adjusting the gate bias j of the peak amplifier 22 of the second amplifier 20 by, for example, an adjustment step of 0.2V so that the differential wave g is always minimized. As a result, the phase and amplitude of the transmission wave b approach the phase and amplitude of the transmission wave a to obtain an optimal combined transmission wave c (see, e.g., FIG. 5).

Further, while fixing the gate bias j of the peak amplifier 22 adjusted so as to minimize the differential wave g, the differential signal calculation unit 7 and the gate bias calculation unit 8 may adjust the gate bias j of the peak amplifier 12 of the first amplifier 10 so that the differential wave g is always minimized. For example, the differential signal calculation unit 7 and the gate bias calculation unit 8 change the phase and amplitude of the first amplifier 10 by adjusting the gate bias j of the peak amplifier 12 by, for example, an adjustment step of 0.1V so that the differential wave g is always minimized. As a result, the phase and amplitude of the transmission wave b further approach the phase and amplitude of the transmission wave a to obtain a more optimal combined transmission wave c (see, e.g., FIG. 5).

Therefore, according to the first embodiment, since the transmission wave a and the transmission wave b adjusted so that their phases and amplitudes match are combined by the combiner 33, an increase in combined loss may be suppressed, thereby preventing the power reduction of the combined transmission wave c after the combination of the waves and the reduction of the efficiency of the amplification device. In addition, during the operation of the radio communication apparatus, even when the phase or amplitude between the transmission wave a and the transmission wave b shifts due to a change in environment such as the temperature or the like, both of the transmission waves may be combined with the phases and amplitudes thereof substantially matched. Therefore, even when the environment changes during operation, it is possible to prevent the decrease of power of the combined transmission wave c and the reduction of efficiency of the amplification device.

Next, the differential signal calculation process performed by the differential signal calculation unit 7 will be described in more detail.

Figure 6:
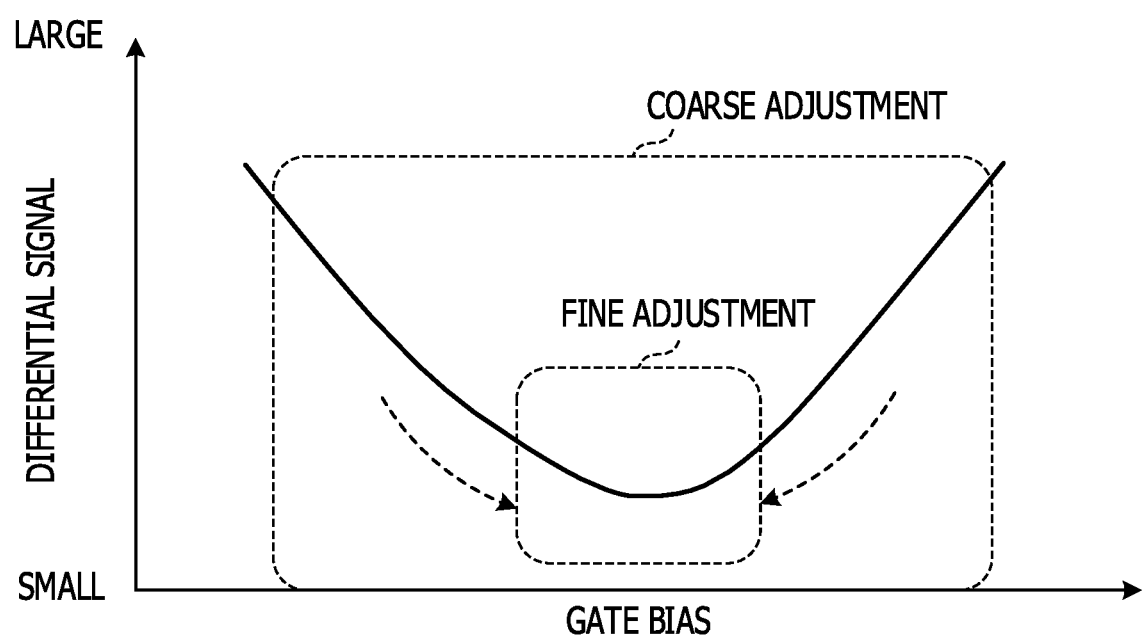
FIG. 6 is a view for explaining an example of a differential signal calculating process.

FIG. 6 illustrates the movement of the value of the differential signal h when the gate bias calculation unit 8 changes the gate bias of the peak amplifier 22 or the peak amplifier 12 as the differential signal calculation unit 7 performs the differential signal calculation process. After the differential signal calculation unit 7 causes the gate bias calculation unit 8 to coarsely adjust the gate bias j so that the value of the differential signal h is minimized, the differential signal calculation unit 7 performs the differential signal calculation process to finely adjust the gate bias j so that the value of the differential signal h is minimized. The differential signal calculation unit 7 uses, for example, a hill climbing method, which is one of local search methods, to search for the gate bias j to minimize the value of the differential signal h (i.e., the parameter i for adjustment to the gate bias j to minimize the value of the differential signal h).

Figure 7:
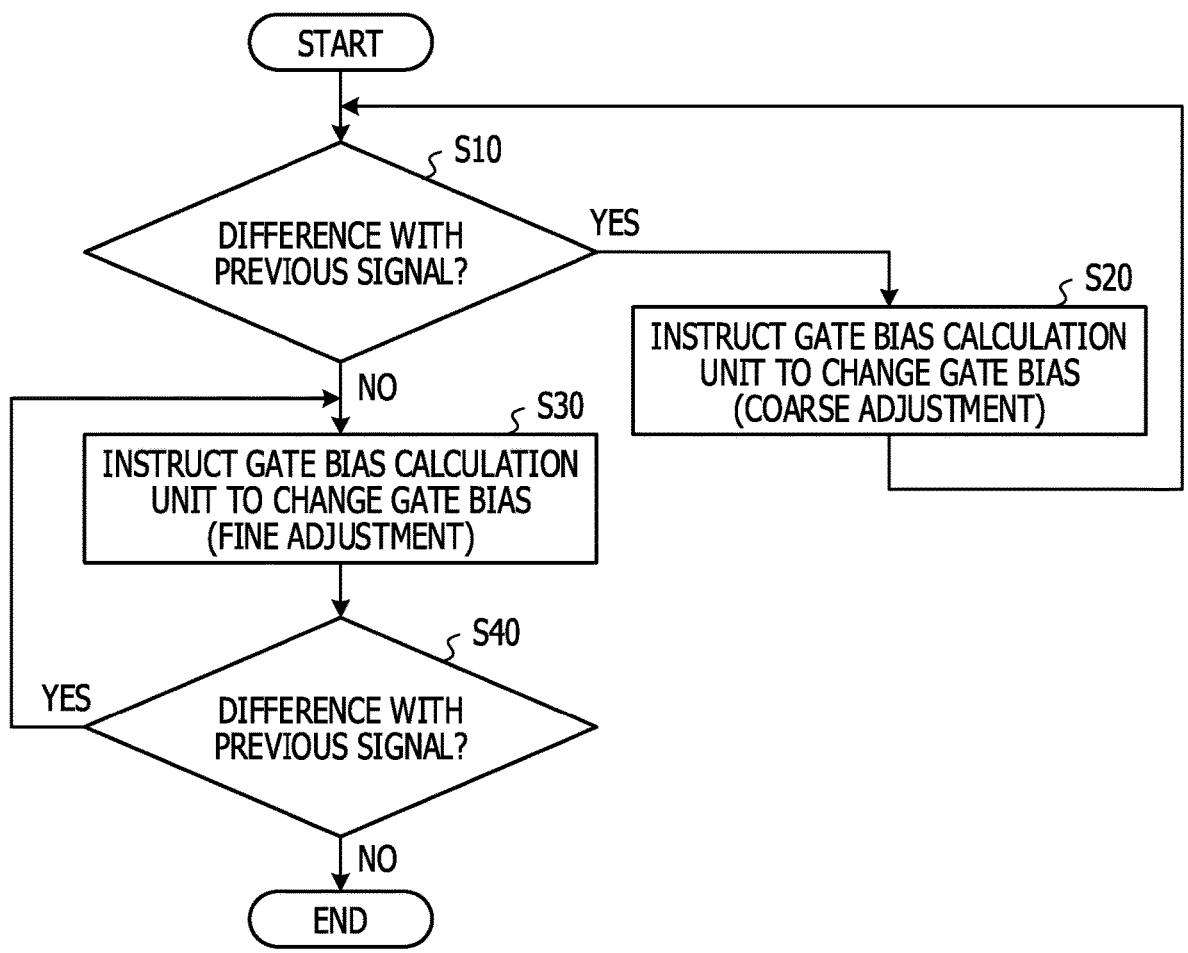
FIG. 7 is a flowchart illustrating an example of the procedure of the differential signal calculating process.

FIG. 7 is a flowchart illustrating an example of the procedure of the differential signal calculation process. The differential signal calculation unit 7 performs the process to implement the control method of the amplification device 111. Next, the details of FIG. 7 will be described with reference to FIG. 6. Numerical values used for the description of FIG. 7 are merely an example. FIG. 7 illustrates a flow of calculating the optimal gate bias j (parameter i) using the hill climbing method.

Operations S10 and S20 represent the procedure for coarse adjustment.

When the differential signal calculation unit 7 first instructs the gate bias calculation unit 8 to coarsely adjust the gate bias j, the differential signal calculation unit 7 instructs the gate bias calculation unit 8 to change the gate bias j of the peak amplifier 22 by +0.2V from an initial value. Whether the gate bias j is changed from the initial value in the positive (+) direction or in the negative (−) direction is determined in advance by design.

The differential signal calculation unit 7 compares the previous value of the differential signal h with the current value thereof in a state where the gate bias j of the peak amplifier 22 is changed by +0.2V from the initial value (operation S10).

In a state where the gate bias j of the peak amplifier 22 is changed by +0.2V from the initial value, when the current value of the differential signal h is larger than the previous value thereof, the differential signal calculation unit 7 instructs the gate bias calculation unit 8 to change the gate bias j of the peak amplifier 22 by −0.2V from the initial value (operation S20). Then, in a state where the gate bias j of the peak amplifier 22 is changed by −0.2V from the initial value, when the current value of the differential signal h is larger than the previous value thereof, the differential signal calculation unit 7 instructs the gate bias calculation unit 8 to return the gate bias j to the initial value. In this case, the differential signal calculation unit 7 regards that there is no difference between the previous value and the current value, sets the coarse adjustment value of the gate bias j to the initial value, and moves the process to operation S30. Meanwhile, in a state where the gate bias j of the peak amplifier 22 is changed by −0.2V from the initial value, when the current value of the differential signal h is smaller than the previous value thereof, the differential signal calculation unit 7 instructs the gate bias calculation unit 8 to further change the gate bias j by −0.2V (operation S20). When this procedure is repeated until the current value of the differential signal h becomes larger than the previous value thereof, and it is detected that the current value of the differential signal h is larger than the previous value thereof, the differential signal calculation unit 7 sets the coarse adjustment value of the gate bias j to the gate bias j of the previous value, and moves the process to operation S30.

In the meantime, in a state where the gate bias j of the peak amplifier 22 is changed by +0.2V from the initial value, when the current value of the differential signal h is smaller than the previous value thereof, the differential signal calculation unit 7 instructs the gate bias calculation unit 8 to further change the gate bias j of the peak amplifier 22 by +0.2V (operation S20). When this procedure is repeated until the current value of the differential signal h becomes larger than the previous value thereof, and it is detected that the current value of the differential signal h is larger than the previous value thereof, the differential signal calculation unit 7 sets the coarse adjustment value of the gate bias j to the gate bias j of the previous value, and moves the process to operation S30.

Operations S30 and S40 represent the procedure for fine adjustment.

When the differential signal calculation unit 7 instructs the gate bias calculation unit 8 to finely adjust the gate bias j, the differential signal calculation unit 7 instructs the gate bias calculation unit 8 to change the gate bias j of the peak amplifier 22 by +0.05V from the coarse adjustment value (operation S30). Whether the gate bias j is changed from the coarse adjustment value in the positive (+) direction or in the negative (−) direction is determined in advance by design. That is, the adjustment width per one time of the gate bias j is set to be narrower in the fine adjustment than in the coarse adjustment.

The differential signal calculation unit 7 compares the previous value of the differential signal h with the current value thereof in a state where the gate bias j of the peak amplifier 22 is changed by +0.05V from the coarse adjustment value (operation S40).

In a state where the gate bias j of the peak amplifier 22 is changed by +0.05V from the coarse adjustment value, when the current value of the differential signal h is larger than the previous value thereof, the differential signal calculation unit 7 instructs the gate bias calculation unit 8 to change the gate bias j of the peak amplifier 22 by −0.05V from the coarse adjustment value (operation S30). Then, in a state where the gate bias j of the peak amplifier 22 is changed by −0.05V from the coarse adjustment value, when the current value of the differential signal h is larger than the previous value thereof, the differential signal calculation unit 7 instructs the gate bias calculation unit 8 to return the gate bias j to the coarse adjustment value. In this case, the differential signal calculation unit 7 regards that there is no difference between the previous value and the current value, sets the final adjustment value of the gate bias j to the coarse adjustment value, and ends the process. Meanwhile, in a state where the gate bias j of the peak amplifier 22 is changed by −0.05V from the coarse adjustment value, when the current value of the differential signal h is smaller than the previous value thereof, the differential signal calculation unit 7 instructs the gate bias calculation unit 8 to further change the gate bias j by −0.05V (operation S30). When this procedure is repeated until the current value of the differential signal h becomes larger than the previous value thereof, and it is detected that the current value of the differential signal h is larger than the previous value thereof, the differential signal calculation unit 7 sets the final adjustment value of the gate bias j to the gate bias j of the previous value, and ends the process.

In the meantime, in a state where the gate bias j of the peak amplifier 22 is changed by +0.05V from the initial value, when the current value of the differential signal h is smaller than the previous value thereof, the differential signal calculation unit 7 instructs the gate bias calculation unit 8 to further change the gate bias j of the peak amplifier 22 by +0.05V (operation S30). When this procedure is repeated until the current value of the differential signal h becomes larger than the previous value thereof, and it is detected that the current value of the differential signal h is larger than the previous value thereof, the differential signal calculation unit 7 sets the final adjustment value of the gate bias j to the gate bias j of the previous value, and ends the process.

The final adjustment value of the gate bias j of the peak amplifier 22 derived in this manner corresponds to the optimal gate bias j that minimizes the differential wave g.

Further, in a state where the gate bias j of the peak amplifier 22 of the second amplifier 20 is fixed at the final adjustment value, the differential signal calculation unit 7 may adjust the gate bias j of the peak amplifier 12 of the first amplifier 10 so that the differential wave g is always minimized. The method of adjusting the gate bias j of the peak amplifier 12 may be the same as that illustrated in FIG. 7. Therefore, the detailed description of the method of adjusting the gate bias j of the peak amplifier 12 will be omitted by referring to the above description of FIG. 7. For example, in both the coarse adjustment and the fine adjustment, the adjustment width per one time of the gate bias j of the peak amplifier 12 is set to be narrower than the adjustment width per one time of the gate bias j of the peak amplifier 22. As a result, the gate bias j of the peak amplifier 12 that outputs the more optimal combined transmission wave c from the amplification device 111 may be derived with higher accuracy.

Figure 8:
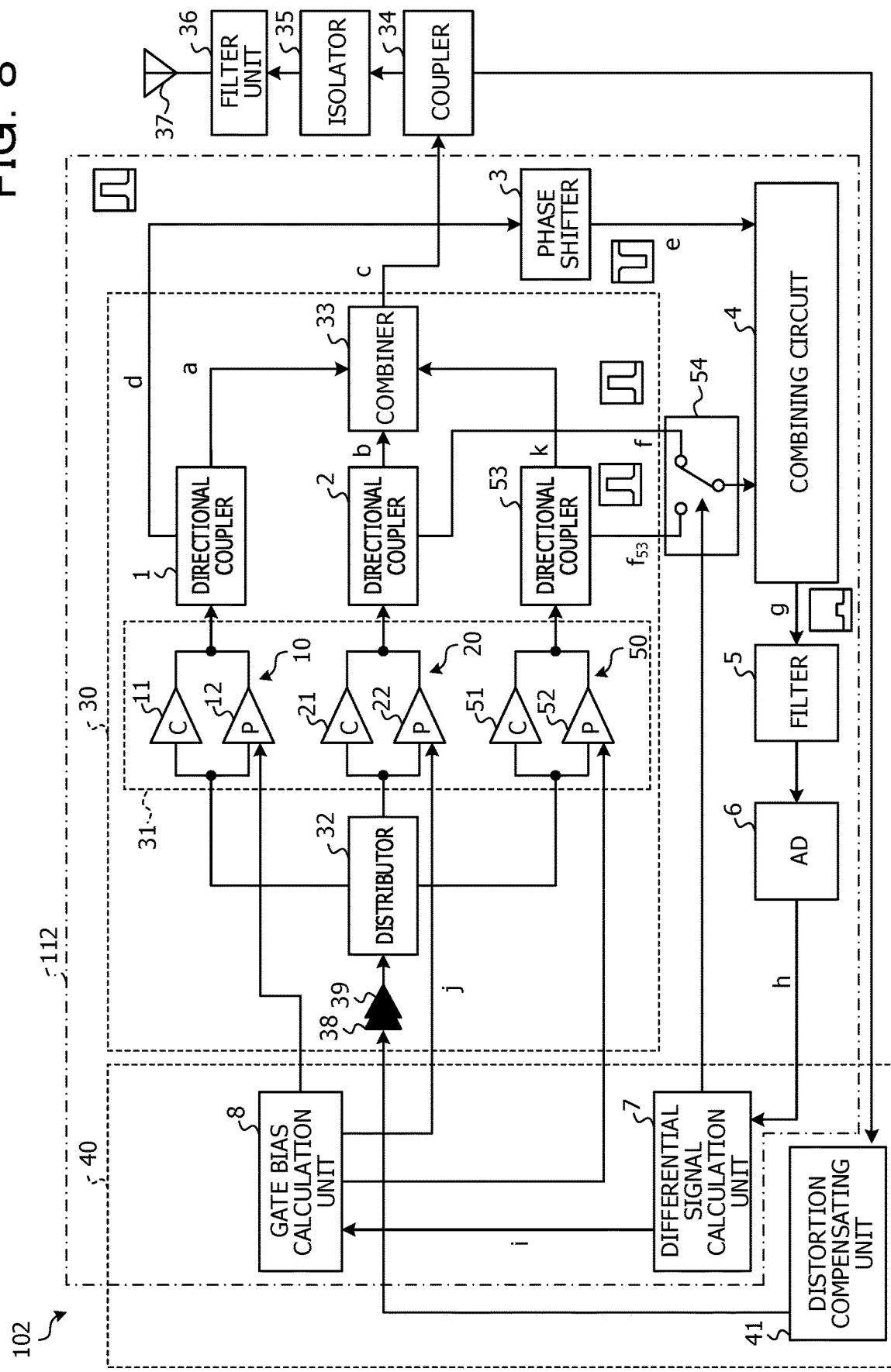
FIG. 8 is a view illustrating an example of the configuration of a radio communication apparatus according to a second embodiment.

FIG. 8 is a view illustrating an example of the configuration of a radio communication apparatus 102 provided with an amplification device 112 of a second embodiment. The same components as those illustrated in FIGS. 1 and 4 are denoted by the same reference numerals, and the explanation thereof will be omitted or simplified by referring to the above description.

In the first embodiment illustrated in FIG. 4, two amplifiers are connected in parallel. However, the second embodiment illustrated in FIG. 8 is different from the first embodiment in that three amplifiers are connected in parallel in the second embodiment. Further, the amplification device 112 illustrated in FIG. 8 includes a third directional coupler 53 and a switch circuit 54.

The amplification device 112 includes three amplifiers 10, 20 and 50 connected in parallel. The third amplifier 50 is a Doherty amplifier having the same characteristics as the amplifiers 10 and 20 and having, for example, a carrier amplifier 51 and a peak amplifier 52 whose inputs and outputs are respectively connected in parallel with each other.

The third directional coupler 53 is a device that is disposed in a signal line between the output of the third amplifier 50 and the third input of the combiner 33, and extracts a part of the output signal of the third amplifier 50 (transmission wave $f_{53}$).

The output signals of the plurality of amplifiers 10, 20, and 50 (transmission waves a, b, and k) are combined by the combiner 33 after impedance matching. The combiner 33 outputs, to the coupler 34, a transmission signal obtained by combining the output signals of the plurality of amplifiers 10, 20, and 50.

As in the first embodiment, the differential signal calculation unit 7 and the gate bias calculation unit 8 adjust the gate bias j of the peak amplifier 22 so that the differential wave g between the transmission wave e and the transmission wave f is minimized. Thereafter, the differential signal calculation unit 7 and the gate bias calculation unit 8 adjust the gate bias j of the peak amplifier 12 so that the differential wave g is minimized. Next, the differential signal calculation unit 7 switches the switch circuit 54 so that the transmission wave e and the transmission wave $f_{53}$ are combined by the combining circuit 4. As in the first embodiment, the differential signal calculation unit 7 and the gate bias calculation unit 8 adjust the gate bias j of the peak amplifier 52 so that the differential wave g between the transmission wave e and the transmission wave $f_{53}$ is minimized.

As a result, the gate biases j of the peak amplifiers 12, 22, and 52 that output the more optimal combined transmission wave c from the amplification device 112 may be derived with higher accuracy.

Although an amplification device, a radio communication apparatus, and an amplification control method have been described above by way of embodiments, the present disclosure is not limited to the above embodiments. Various modifications and improvements, such as combinations or permutations with a part or all of other embodiments, are possible without departing from the scope of the present disclosure.

For example, although a radio base station apparatus has been illustrated in the above description, the present disclosure may also be applied to other radio communication apparatuses such as a radar and so on.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplification device comprising:
   a plurality of amplifiers arranged in parallel;
   a plurality of directional couplers coupled to the plurality of amplifiers, respectively, and configured to receive output signals of the plurality of amplifiers, respectively;
   a phase shifter coupled to a first directional coupler of the plurality of directional couplers, and configured to generate a first signal to which a phase of an output signal of the first directional coupler is inverted;
   a combining circuit coupled to the phase shifter and a second directional coupler of the plurality of directional couplers, and configured to combine an output signal of the phase shifter and an output signal of the second directional coupler; and
   a processor configured to control at least one of the plurality of amplifiers so that a level of an output signal of the combining circuit is minimized.

2. The amplification device according to claim 1,
   wherein the plurality of amplifiers include a first amplifier and a second amplifier which are arranged in parallel, and
   wherein the processor is configured to control the second amplifier so that the level of the output signal of the combining circuit is minimized.

3. The amplification device according to claim 2,
   wherein the processor is configured to:
   control the second amplifier to hold the level of the output signal of the combining circuit, and
   control the first amplifier so that the level of the output signal of the combining circuit is minimized, in a state where the control of the second amplifier is held.

4. The amplification device according to claim 2,
   wherein each of the first amplifier and the second amplifier is a Doherty amplifier including a carrier amplifier and a peak amplifier, and
   wherein the processor is configured to control the peak amplifier so that the level of the output signal of the combining circuit is minimized.

5. The amplification device according to claim 1,
   wherein the processor is configured to control at least one of the plurality of amplifiers using a hill climbing method in which a gate bias of the at least one of the plurality of amplifiers is coarsely controlled and then finely controlled, so that the level of the output signal of the combining circuit is minimized.

6. A radio communication apparatus comprising:
   an amplification device configured to include:
   a plurality of amplifiers arranged in parallel,
   a plurality of directional couplers coupled to the plurality of amplifiers, respectively, and configured to receive output signals of the plurality of amplifiers, respectively,
   a phase shifter coupled to a first directional coupler of the plurality of directional couplers, and configured to generate a first signal to which a phase of an output signal of the first directional coupler is inverted,
   a combining circuit coupled to the phase shifter and a second directional coupler of the plurality of directional couplers, and configured to combine an output signal of the phase shifter and an output signal of the second directional coupler, and
   a processor configured to control at least one of the plurality of amplifiers so that a level of an output signal of the combining circuit is minimized; and
   an antenna configured to wirelessly transmit a signal amplified by the amplification device.

7. The radio communication apparatus according to claim 6,
   wherein the plurality of amplifiers include a first amplifier and a second amplifier which are arranged in parallel, and
   wherein the processor is configured to control the second amplifier so that the level of the output signal of the combining circuit is minimized.

8. The radio communication apparatus according to claim 7,
   wherein the processor is configured to:
   control the second amplifier to hold the level of the output signal of the combining circuit, and
   control the first amplifier so that the level of the output signal of the combining circuit is minimized, in a state where the control of the second amplifier is held.

9. The radio communication apparatus according to claim 7,
   wherein each of the first amplifier and the second amplifier is a Doherty amplifier including a carrier amplifier and a peak amplifier, and
   wherein the processor is configured to control the peak amplifier so that the level of the output signal of the combining circuit is minimized.

10. The radio communication apparatus according to claim 6,
    wherein the processor is configured to control at least one of the plurality of amplifiers using a hill climbing method in which a gate bias of the at least one of the plurality of amplifiers is coarsely controlled and then finely controlled, so that the level of the output signal of the combining circuit is minimized.

11. An amplification control method comprising:
    amplifying a signal, by a plurality of amplifiers arranged in parallel;
    receiving output signals of the plurality of amplifiers, by a plurality of directional couplers coupled to the plurality of amplifiers, respectively;
    generating a first signal to which a phase of an output signal of a first directional coupler of the plurality of directional couplers is inverted, by a phase shifter coupled to the first directional coupler;
    combining an output signal of the phase shifter and an output signal of the second directional coupler, by a combining circuit coupled to the phase shifter and a second directional coupler of the plurality of directional couplers; and
    controlling at least one of the plurality of amplifiers so that a level of an output signal of the combining circuit is minimized, by a processor.

12. The amplification control method according to claim 11, wherein the plurality of amplifiers include a first amplifier and a second amplifier which are arranged in parallel, and wherein the processor controls the second amplifier so that the level of the output signal of the combining circuit is minimized.

13. The amplification control method according to claim 12, wherein the processor controls the second amplifier to hold the level of the output signal of the combining circuit, and controls the first amplifier so that the level of the output signal of the combining circuit is minimized, in a state where the control of the second amplifier is held.

14. The amplification control method according to claim 12, wherein each of the first amplifier and the second amplifier is a Doherty amplifier including a carrier amplifier and a peak amplifier, and wherein the processor controls the peak amplifier so that the level of the output signal of the combining circuit is minimized.

15. The amplification control method according to claim 11, wherein the processor controls at least one of the plurality of amplifiers using a hill climbing method in which a gate bias of the at least one of the plurality of amplifiers is coarsely controlled and then finely controlled, so that the level of the output signal of the combining circuit is minimized.

* * * * *